(12) United States Patent
Johancsik

(10) Patent No.: US 8,410,968 B2
(45) Date of Patent: Apr. 2, 2013

(54) TRACK AND HOLD CIRCUIT

(75) Inventor: Tracy Johancsik, Murray, UT (US)

(73) Assignee: Crest Semiconductors, Inc., San Jose, CA (US)

( * ) Notice: Subject to any disclaimer, the term of this patent is extended or adjusted under 35 U.S.C. 154(b) by 157 days.

(21) Appl. No.: 13/010,140

(22) Filed: Jan. 20, 2011

(65) Prior Publication Data

US 2012/0188110 A1 Jul. 26, 2012

(51) Int. Cl.
*H03M 1/38* (2006.01)
(52) U.S. Cl. .......................... 341/161; 341/122
(58) Field of Classification Search .......... 341/161, 341/122, 123, 124, 155, 172, 150; 327/94, 327/96
See application file for complete search history.

(56) References Cited

U.S. PATENT DOCUMENTS

| | | | |
|---|---|---|---|
| 7,136,000 B1 * | 11/2006 | Hidri et al. | 341/122 |
| 2006/0066466 A1 * | 3/2006 | Pan et al. | 341/161 |
| 2010/0007326 A1 * | 1/2010 | Nakazato | 324/71.5 |

* cited by examiner

*Primary Examiner* — Joseph Lauture
(74) *Attorney, Agent, or Firm* — Steven L. Nichols; Van Cott, Bagley, Cornwall & McCarthy P.C.

(57) ABSTRACT

A track and hold circuit includes an input, a first output configured to produce a first output signal, and a second output configured to produce a second output signal while the track and hold circuit is in a first mode. While the track and hold circuit is in a second mode, the second output signal is combined with the first output signal and output on the first output.

20 Claims, 5 Drawing Sheets

TRACK AND HOLD CIRCUIT

BACKGROUND

Electronic devices typically make use of both analog and digital signals. An analog signal is a continuous signal which may assume any value. A digital signal is one in which may assume one of a discrete set of values. A signal may be in the form of an electrical current or a voltage. Electrical current is the measurement of the flow of electrons. Voltage may be defined as the difference between electric potential at two given points.

Electronic circuitry often includes devices for transferring analog signals into digital signals and vice versa. For example, a Digital-to-Analog Converter (DAC) may be used to transfer digital signals into analog signals. Conversely, an Analog-to-Digital Converter (ADC) may be used to transfer analog signals into digital signals.

One type of circuit which is often used when converting analog signals to digital signals is a track and hold circuit. A track and hold circuit switches between a track mode and a hold mode. While in track mode, an input signal is often fed to a storage node. When the circuit switches to hold mode, the storage node holds the value of the input signal at the time the switch occurs. This held value is then output from the track and hold circuit for the duration of time in which the circuit is in hold mode. The output signal may require amplification. However, amplification naturally consumes power and requires additional components which may require additional space on the chip holding the track and hold components.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
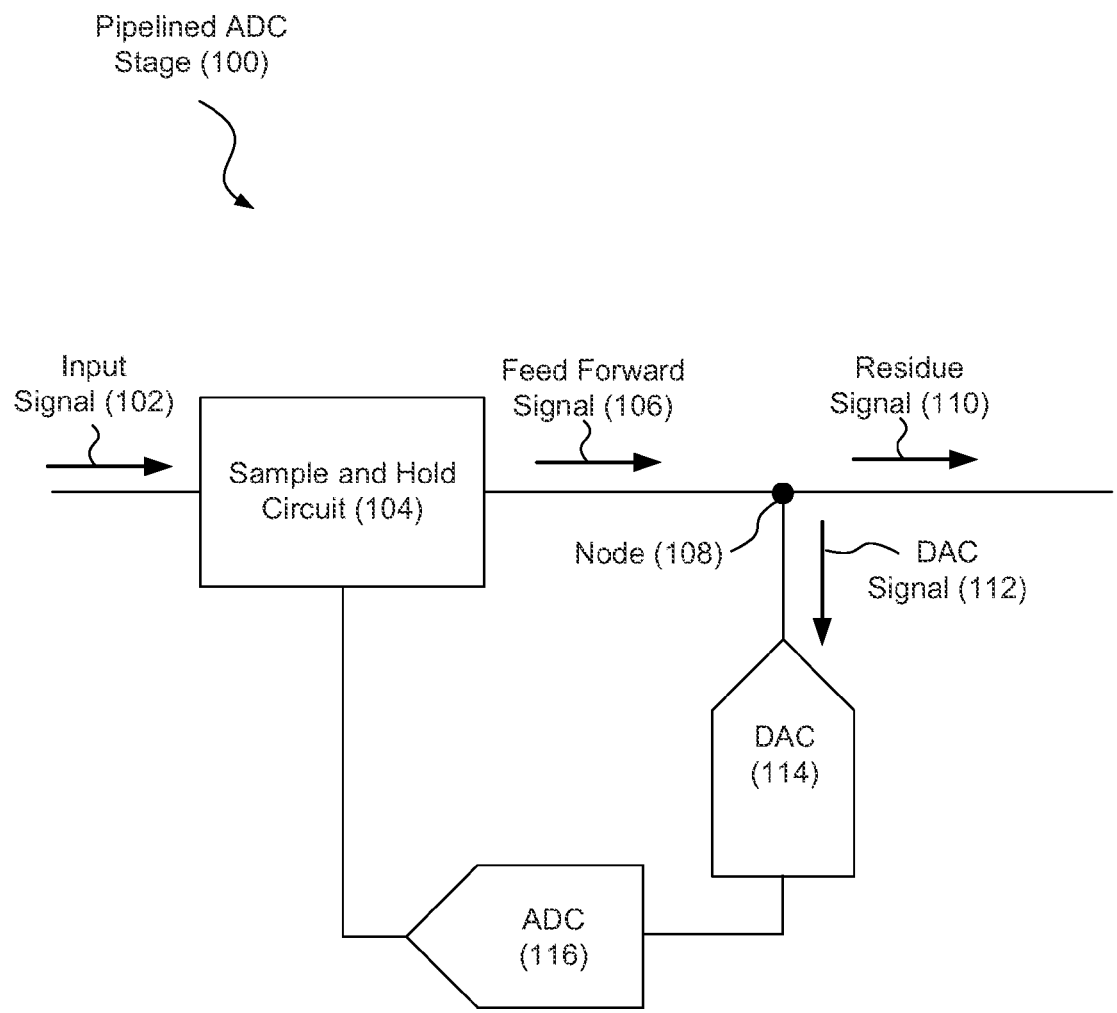
FIG. 1 is a diagram showing an illustrative pipelined analog-to-digital converter stage, according to one embodiment of principles described herein.

As mentioned above, an output of a track and hold circuit may require amplification. However, amplification naturally consumes power and requires additional components which may require additional chip space. When a track and hold circuit is used in a pipelined ADC stage, the track and hold circuit often includes two outputs. One output feeds to the next stage, and the other output feeds to a low resolution ADC. Generally, the low resolution ADC only requires an output signal from the track and hold circuit when the track and hold circuit is in track mode.

In light of these and other issues, the present specification relates to a track and hold circuit capable of providing a first signal from a first output and a second signal from a second output. During a track mode, the second output tracks the input of the track and hold circuit. During a hold mode, the held value from the second output is combined with the held value of the first output, effectively amplifying the held value output on the first output. The held value is the value of the input at the instant the track and hold circuit switched to the hold mode. According to certain illustrative embodiments, the track and hold circuit may include a storage node configured to track an input signal when the track and hold circuit is in a track mode. Additionally, the storage node may store a signal value of the input signal when the track and hold circuit switches to hold mode. The stored signal value may then be applied to the first output for the duration of the hold mode. The track and hold circuit may also include a current copier configured to produce a copy of the input signal. The copied signal is then added to the signal value provided to the first output when the track and hold circuit is in hold mode.

Through use of a system or method embodying principles described herein, a track and hold circuit may provide the input signal to one output during a track mode and an amplified signal to another output during hold mode. The amplification may be performed without the need for additional amplification components on the output of the track and hold circuit. Such a design may allow for a storage node with a lower capacitance. Thus, the track and hold circuit is able to operate at higher frequencies. Additionally, less power is consumed and less chip space is required.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As used in the present specification and in the appended claims, the term "signal" is to be broadly interpreted as an electrical signal which may be in the form of an electrical current or a voltage. A signal may refer to either an analog signal or a digital signal. The analog signal can be either a continuous or discrete time signal. An analog discrete time signal is one that can take on more than two discrete values.

Referring now to the figures, FIG. 1 is a diagram showing an illustrative pipelined ADC stage (100). A pipelined ADC converts an analog signal into a digital signal using multiple successive stages. According to certain illustrative embodiments, each stage (100) within a pipelined ADC may include a track and hold circuit (104) a Digital-to-Analog Converter (DAC) (114), and an ADC (116).

A track and hold circuit (104) essentially operates in two modes. One mode is a "track" mode, sometimes referred to as a "track" mode. The other mode is a "hold" mode. While the track and hold circuit (104) is in "track" mode, the output signal may match the input signal (102). While the track and hold circuit is in "hold" mode, the output signal is configured to maintain the value experienced by the input at the time the circuit was switched from "track" mode to "hold" mode. The track and hold circuit (104) thus produces a sampled output signal.

In one embodiment of a pipelined ADC, one output of the track and hold circuit (104) may be used as a feed forward signal (106). An additional output of the track and hold circuit (104) may provide a signal to a low resolution ADC (116). The ADC (116) then produces a quantized version of the analog signal received at the input of the ADC (116). The DAC then produces an analog representation of the quantized signal. This analog representation of the quantized signal is then passed to the summing node to be combined with the feed forward signal (106). The combination of the feed forward signal (106) and the DAC signal (112) produced by the DAC (114) may produce a residue signal (110). The residue signal (110) may then continue on to a subsequent stage within the pipelined ADC or to the final output of the ADC.

If the signals associated with the pipelined ADC are in the form of an electrical current, then the value of the residue signal (110) is in accordance with Kirchhoff's current law. Kirchhoff's current law states that the amount of electrical current entering a node must be equal to the amount of electrical current leaving a node. Thus the summation of the DAC signal (112) and the feed forward signal (106) is equal to the residue signal (110). If current is flowing into a node, it is given a positive value. Conversely, if current is flowing out of a node, it is given a negative value. Thus, the residue signal (110) may be equal to the feed forward signal (106) minus the DAC signal (112).

The track and hold circuit (104) in each pipeline stage (100) holds an analog signal at a specific value for a given period of time. The given period of time is generally designed to be as short as possible. As mentioned above, the track and hold circuit may include two outputs. One output sends the signal to be processed by the ADC and the DAC. The DAC may then produce an output which is combined with the other output from the track and hold circuit (104). The combination of the feed forward signal (106) and the DAC signal (112) results in the DAC signal (112) being subtracted from the feed forward signal (106). Thus the quantized component of the feed forward signal (106) is removed and the resulting residue signal (110) is sent to the next stage. In some cases the reside current may be in the range of 10-100 microamps (μA). In some embodiments, the residue signal (110) may need to be amplified before being sent to the next stage for processing.

As the input signal (102) moves through each successive stage (100) in the pipelined ADC, a more precise value may be determined. The number of stages may affect the number of bits used to represent a given signal value. In general, a higher number of stages will produce a higher resolution digital signal at the final output of the pipelined ADC.

In some embodiments, the input signal (102) to a pipelined ADC may be a voltage signal. In such an embodiment, the first stage of the pipelined ADC may include a voltage-to-current converter. In some embodiments, the track and hold circuit (104) may act as a voltage-to-current converter. Such a device may track a voltage and output a corresponding electrical current. The stage that includes the voltage-to-current computer may also be a subsequent stage instead of the first stage.

In certain embodiments, the ADC (116) may be a flash ADC. Flash ADCs are able to operate at faster rates. However, they require the use of several comparator circuits. Both the ADC (116) and the DAC (114) may be low resolution devices. Low resolution devices use fewer bits and provide a lower level of precision. High resolution devices may not be necessary to perform the intended functions associated with the ADC (116) and the DAC (114) in each pipeline stage.

A current mode pipelined ADC system may be capable of processing any number of bits needed by a particular application. For example, the ADC and DAC in each stage may be a 4-bit flash ADC and a 4-bit DAC, respectively. Alternatively, each stage may be capable of processing 3 bits, 5 bits or any other practical numbers of bits.

Figure 2:
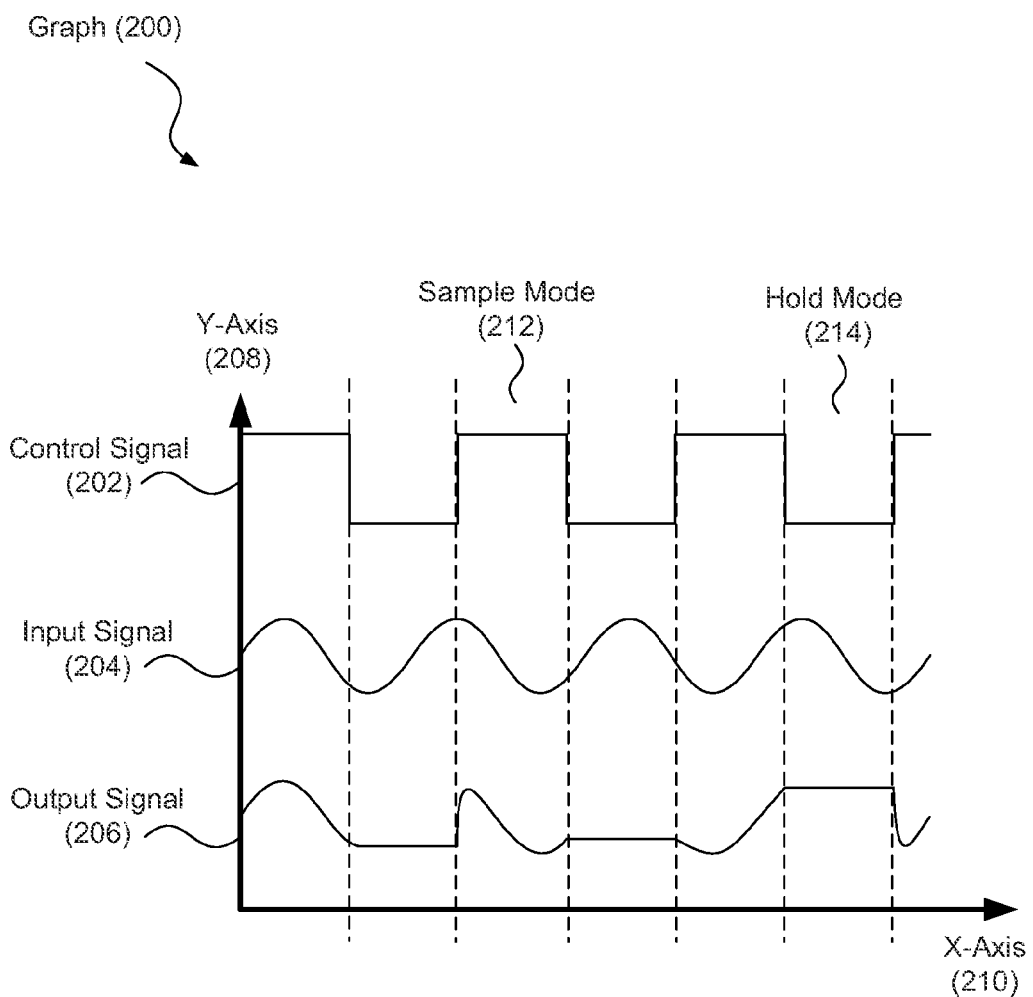
FIG. 2 is a diagram showing an illustrative graph depicting signals associated with a single output track and hold circuit, according to one embodiment of principles described herein.

FIG. 2 is a diagram showing an illustrative graph depicting signals associated with a standard single output track and hold circuit. A track and hold circuit operates in both a track mode (212) and a hold mode (214) depending on a received control signal (202). FIG. 2 illustrates an exemplary time-varying signal for an input signal (204) and an output signal (208) of a track and hold circuit. The y-axis (208) represents relative signal value and the x-axis (210) represents time.

The switching devices associated with a track and hold signal are often controlled by a control signal (202) such as a clock signal. In some embodiments, the switches associated with the track and hold circuit may be switched to track mode (212) when the clock signal is high and switched to hold mode (214) when the clock signal is low.

The input signal (204) illustrated in FIG. 2 is a simple sine wave. As will be appreciated by one skilled in the relevant art, data signals may often be more complex than a simple sine wave. However, for illustrative purposes, the simple sine wave is sufficient.

The output signal (206) may be configured to track the input signal while in track mode (212). Thus for periods when the track and hold circuit is in track mode (212), the output signal (206) closely resembles the input signal (204). For periods of time when the track and hold circuit is in hold mode, the output signal (204) may maintain a relatively constant value.

As mentioned above, when a track and hold circuit is used within a stage of a pipelined ADC, the track and hold circuit provides two outputs. One output may be connected to a flash ADC while the other output may be connected to a subsequent stage. In some embodiments, the flash ADC only requires the output current from the track and hold circuit while the track and hold circuit is in track mode. The output to the flash ADC may be rerouted to the output connected to the subsequent stage. Doing so provides a stronger signal to be output to the subsequent stage without the need for an additional amplification circuit. Thus, a more power efficient track and hold circuit may be realized.

Figure 3A:
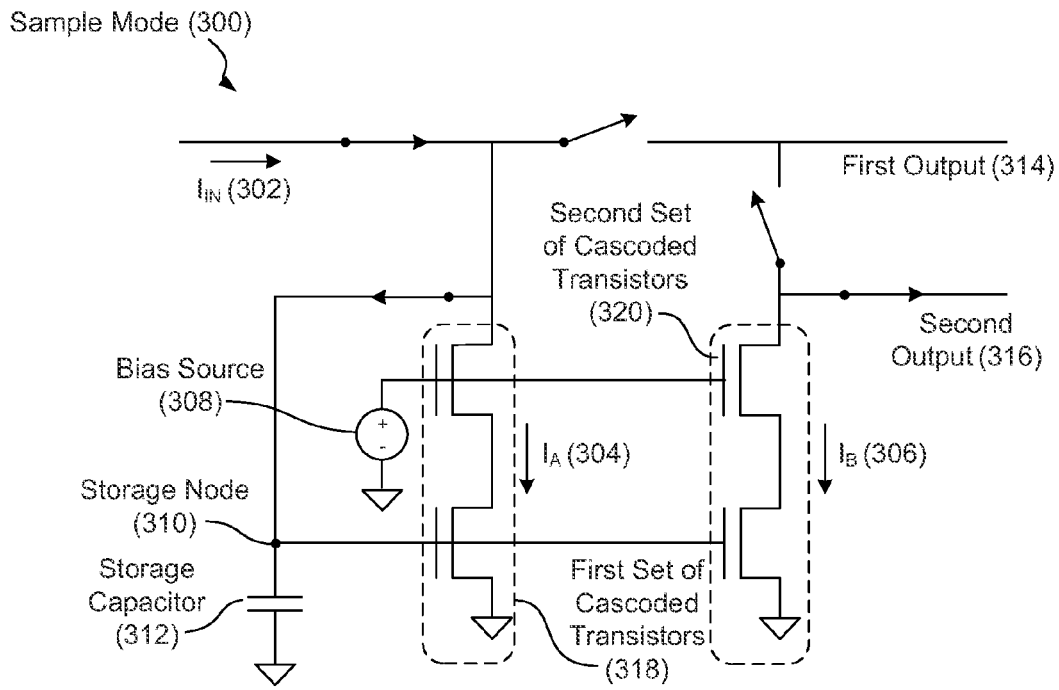
FIG. 3A is a diagram showing an illustrative dual output track and hold circuit in track mode, according to one embodiment of principles described herein.

FIG. 3A is a diagram showing an illustrative dual output track and hold circuit in track mode (300). According to certain illustrative embodiments, an input signal $I_{IN}$ (302) may be applied across a first set of cascaded transistors (318). The current $I_A$ (304) across the first set of cascaded transistors (318) creates a voltage at the gate of the bottom transistor. That voltage is also applied to the gate of the storage capacitor (312) and the bottom transistor from a second set of cascaded transistors (320). The voltage across the bottom transistor from the second set of transistors (320) creates a current $I_B$ (306) which may be routed to a second output (316), such as the output to a flash ADC.

The first set of cascaded transistors (318) combined with the second set of cascaded transistors (320) form a current mirror. A current mirror is an electronic circuit device used to copy a current through an active device, such as a transistor, by controlling the current in another active device. A current mirror allows the input current to remain constant despite any loading that may be applied to the current being copied. The top most transistors from both sets of cascaded transistors (318, 320) may be biased with a bias source (308). As will be appreciated by one skilled in the relevant art, other forms of current mirrors may be used. A system or method embodying principles described herein may not be limited to the current mirror structure illustrated in the figures.

A storage node (310) may include a storage capacitor (312). The storage capacitor (312) value may be chosen based on the needs of the track and hold circuit. In general, a larger capacitor will hold a value longer, but will be less responsive to changes in the input signal. Additionally, a larger capacitor can help reduce noise in the circuit system. Conversely, a smaller capacitor may not hold a value for as long or reduce as much noise, but may be more responsive to changes in the input signal (302). In some cases, a discrete capacitor is not necessary because the intrinsic capacitance at the terminals of the transistors provides the desired level of capacitance.

When used in a pipelined ADC, the first output (314) of the track and hold circuit may be connected to a subsequent stage in the pipeline architecture. While in track mode (300), the switches connected to the first output (314) may be open so that no signal is output to the first output (314). Thus, the output does not match the input as with a traditional track and hold circuit. Rather, the output is disconnected and the resulting high impedance causes no signal to be produced at the output.

The second output (316) of the track and hold circuit may be connected to an ADC of the pipeline stage. The second output (316) behaves like a traditional track and hold. Specifically, while the track and hold circuit is in track mode (300), the signal output to the second output (316) may correspond to the input signal (302). While in hold mode, the output will hold a particular signal value until the circuit returns to track mode. The output signal may be created by the second set of cascaded transistors (320). As mentioned above, the voltage across the first set of transistors (318) creates a voltage across the second set of transistors (320). This voltage creates an electric current (306) to be applied to the second output.

Figure 3B:
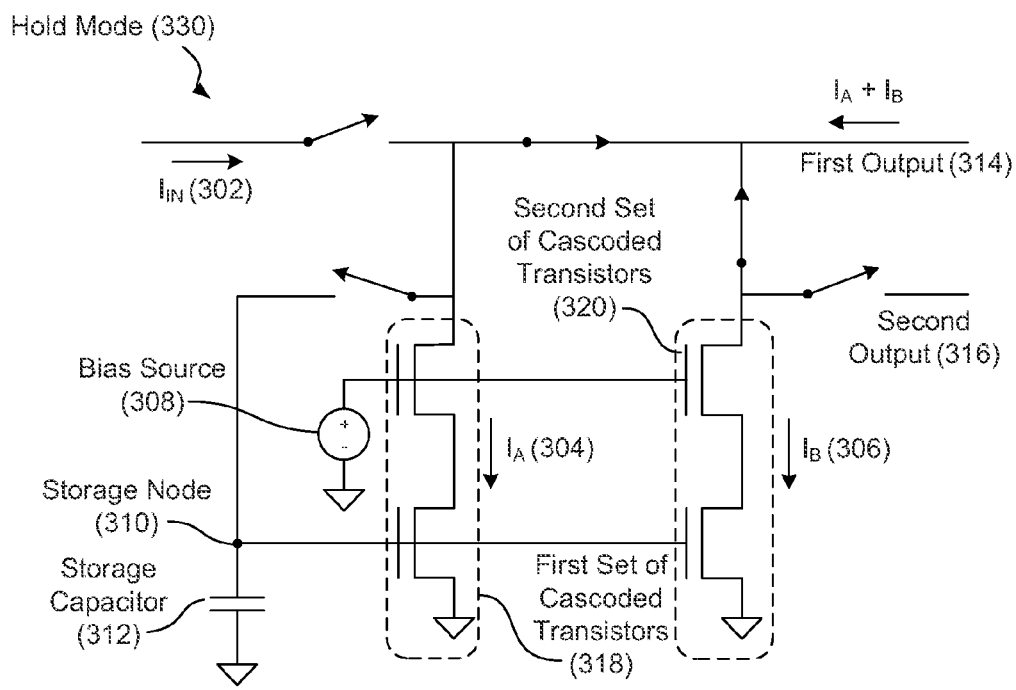
FIG. 3B is a diagram showing an illustrative dual output track and hold circuit in hold mode, according to one embodiment of principles described herein.

FIG. 3B is a diagram showing an illustrative dual output track and hold circuit in hold mode (330). According to certain illustrative embodiments, while the track and hold circuit is in hold mode (330), the switches may be configured to cut off the input signal. The voltage stored in the storage capacitor (312) may create electric current that is fed to the first output (314).

As mentioned above, the voltage across the storage node changes in response to changes to the input signal. While the track and hold circuit is in track mode (300), the voltage across the storage node is dependent upon the input signal. When the track and hold switches to hold mode (330), the voltage across the capacitor remains at the value held at the moment the switch to hold mode (330) took place. Ideally, this voltage is held constant for the duration of the hold mode (330) period.

The voltage across the storage node creates a voltage between the gate and drain of the bottom transistor for each set of transistors (318, 320). The electric current $I_A$ (304) from the first set of cascaded transistors (318) is combined with the electric current $I_B$ (306) from the second set of cascaded transistors (320). The combination of both electric currents (304, 306) is then fed to the first output (314). If the track and hold circuit is being used in a pipelined ADC stage, the first output may then feed the combined electric current signals to the next stage. Additionally, while in hold mode (330), the switches connected to the second output (316) may be switched to prevent any current from being fed to the second output (316).

As will be appreciated by one skilled in the relevant art, the combination of electric currents $I_A$ (304) and $I_B$ (306) essentially provides an amplified sampled value to the first output (314). For example, if the input signal value is 1 milliamp (mA) at the time the track and hold circuit switches to hold mode (330), then both electric currents $I_A$ (304) and $I_B$ (306) will each be 1 mA. Thus, the combination fed to the first output (314) while the track and hold circuit is in hold mode (330) may be 2 mA.

Figure 4:
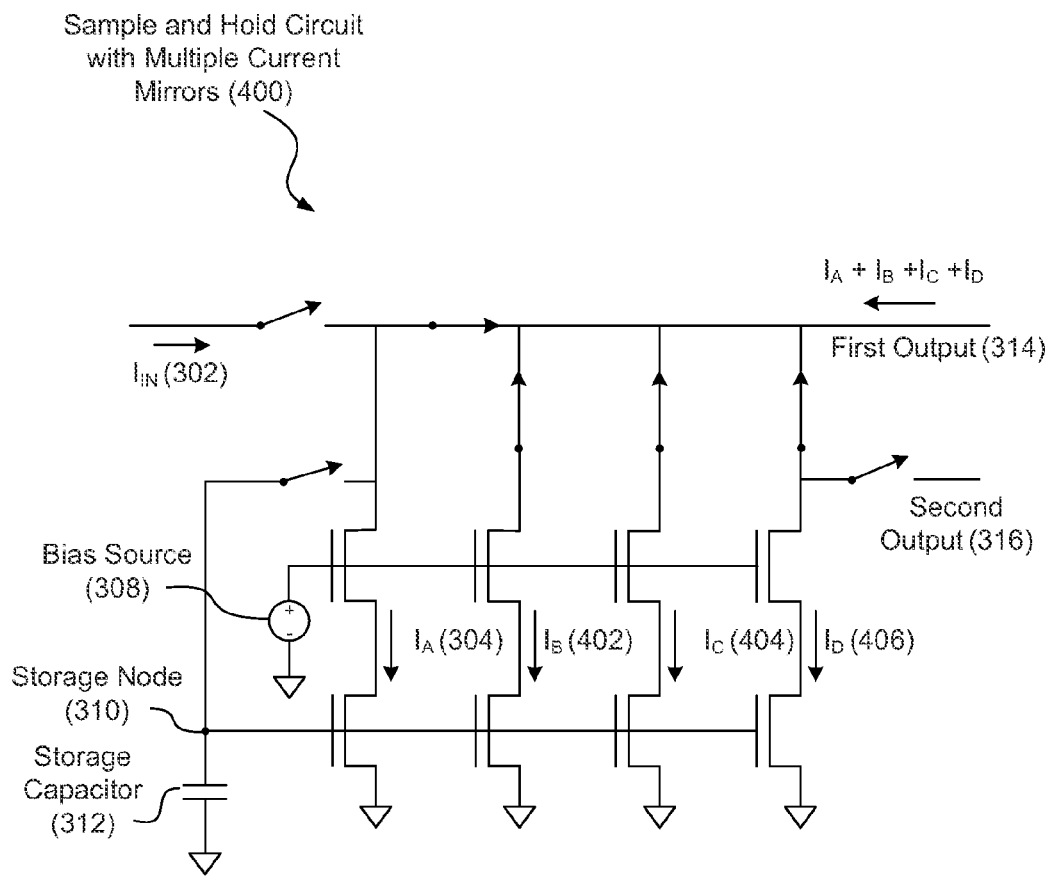
FIG. 4 is a diagram showing an illustrative track and hold circuit having multiple current copiers, according to one embodiment of principles described herein.

FIG. 4 is a diagram showing an illustrative track and hold circuit having multiple current mirrors (400). According to certain illustrative embodiments, a track and hold circuit may be configured to create multiple copies (402, 404, 406) of the output current $I_A$ (304). Such an embodiment may allow for greater gain.

In some embodiments, a greater gain may be desired. The voltage across the storage capacitor (312) may be applied between the gate and drain of several transistors. The electric currents $I_A$ (304), $I_B$ (402), $I_C$ (404), and $I_D$ (406) created by these transistors may be routed to the first output. For example, if the input signal is valued at 1 mA at the time in which the track and hold circuit switches to hold mode, then the total value at the first output throughout the duration of the hold mode period may be 4 mA. In some cases, the currents (402, 404) may be different values rather than duplicates of $I_A$ (304). This can allow for gains that are not integer multiples.

The above described figures illustrate an electronic switch as an arrow. The arrow does not necessarily indicate direction of current flow. As will be appreciated by one skilled in the relevant art, there are multiple types of switching devices which may be used, often made up of transistors or diodes. A track and hold circuit embodying principles described herein may make use of any suitable switching device. In one example, and as shown in FIG. 4, each of the current copiers includes its own switch to the first output (314).

Figure 5:
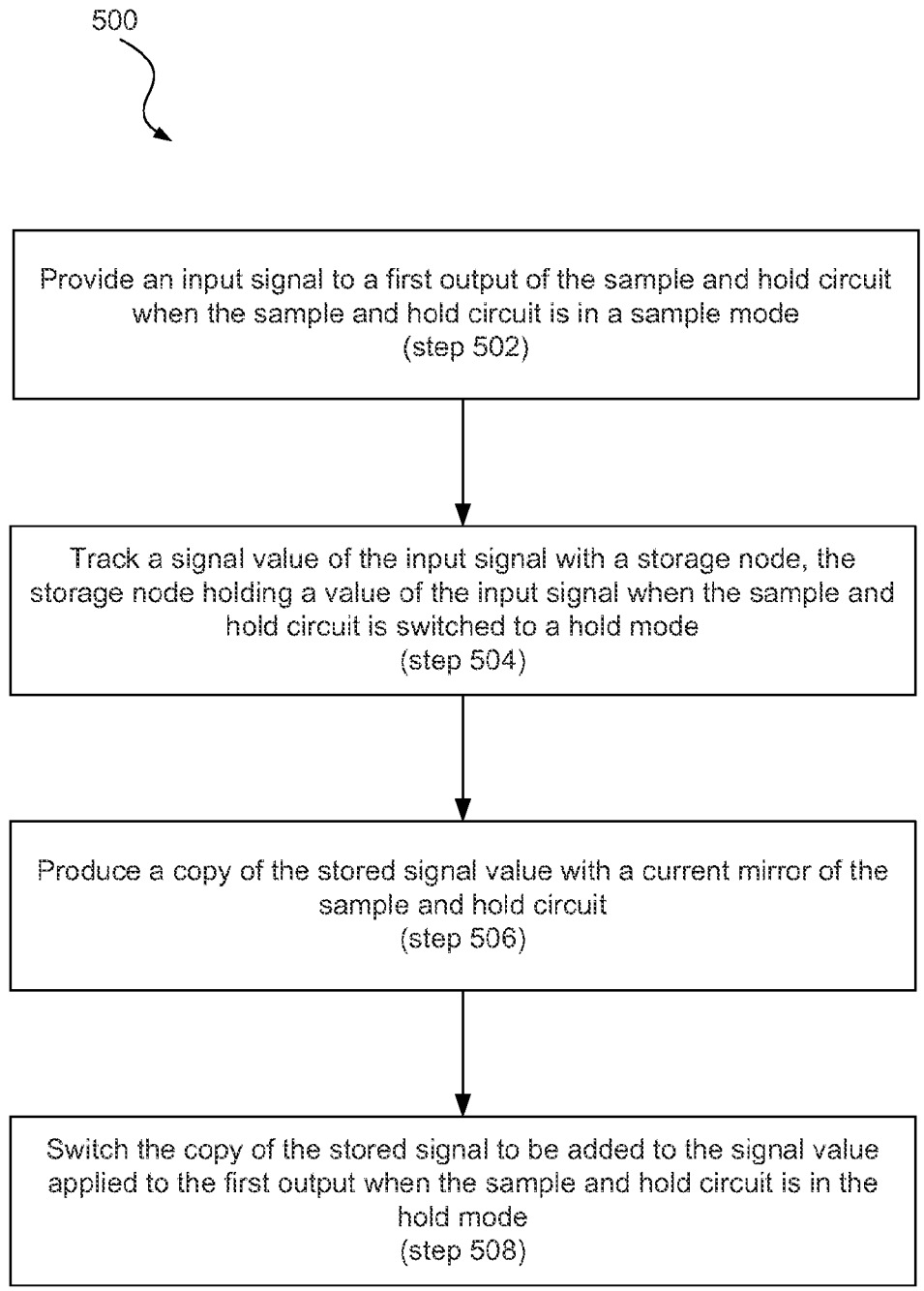
FIG. 5 is a flowchart showing an illustrative method for using a track and hold circuit, according to one embodiment of principles described herein.

FIG. 5 is a flowchart showing an illustrative method (500) for sampling and holding a signal. According to certain illustrative embodiments, the method may include providing (step 502) an input signal to a first output of the track and hold circuit when the track and hold circuit is in a track mode; tracking (step 504) a signal value of the input signal with a storage node, the storage node holding a value of the input signal when the track and hold circuit is switched to a hold mode; producing (step 506) a copy of the stored signal value with a current mirror of the track and hold circuit; and switching (step 508) the copy of the stored signal to be added to the signal value applied to the first output when the track and hold circuit is in the hold mode.

In sum, through use of a system or method embodying principles described herein, a track and hold circuit may provide the input signal to one output during a track mode and an amplified sampled signal to another output during hold mode. The amplification may be performed without the need for additional amplification components on the output of the track and hold circuit. Such a design may avow for a storage node with a lower capacitance. Thus, the track and hold circuit is able to operate at higher frequencies. Additionally, less power is consumed and less chip space is required. Although single ended circuits have been used as examples, the principles described herein may also be applied to differential circuits.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A track and hold circuit comprising:
an input;
a first output configured to produce a first output signal; and
a second output configured to produce a second output signal while said track and hold circuit is in a first mode;
in which while said track and hold circuit is in a second mode, said second output signal is combined with said first output signal and output on said first output.

2. The circuit of claim 1, further comprising a storage node configured to track an input signal of said input while said track and hold circuit is in said first mode and hold said input signal at a value equal to said input signal when said track and hold circuit is switched to said second mode.

3. The circuit of claim 1, further comprising a current mirror to produce a copy of said input signal.

4. The circuit of claim 3, in which an output of said current mirror is switched to said second output while said track and hold circuit is in said first mode and is switched to said first output while said track and hold circuit is in said second mode.

5. The circuit of claim 3, further comprising a number of additional current mirrors configured to produce an additional number of copies of said input signal.

6. The circuit of claim 5, in which said additional number of copies of said input signal are added to said sampled signal value provided to said second output when said track and hold circuit is in said hold mode.

7. The circuit of claim 6, in which said first output is connected to a subsequent stage within said pipelined ADC.

8. The circuit of claim 6, in which said first output is connected to an ADC of said stage of said pipelined ADC.

9. The circuit of claim 1, in which said track and hold circuit is part of a stage of a pipelined Analog-to-Digital Converter (ADC).

10. A method for sampling and holding a signal, the method comprising:
providing an input signal to a first output of said track and hold circuit when said track and hold circuit is in a track mode;
tracking a signal value of said input signal with a storage node, said storage node holding a value of said input signal when said track and hold circuit is switched to a hold mode;
producing a copy of said stored signal value with a current mirror of said track and hold circuit; and
switching said copy of said stored signal to be added to said signal value applied to said first output when said track and hold circuit is in said hold mode.

11. The method of claim 10, in which said current mirror comprises a number of MOSFET devices.

12. The method of claim 11, in which said MOSFET devices comprise a cascode structure.

13. The method of claim 10, further comprising producing a number of additional copies of said stored signal value with additional current mirrors associated with said track and hold circuit.

14. The method of claim 13, further comprising switching said additional copies of said stored signal to be added to said signal value applied to said second output when said track and hold circuit is in said hold mode.

15. The method of claim 10, in which said track and hold circuit is part of a stage of a pipelined Analog-to-Digital Converter (ADC).

16. The method of claim 15, in which said second output is connected to a subsequent stage within said pipelined ADC.

17. The method of claim 15, in which said first output is connected to an ADC of said stage of said pipelined ADC.

18. An electronic circuit comprising:
a track and hold circuit configured to:
provide an input signal to a first output of said track and hold circuit when said track and hold circuit is in a track mode;
track a signal value of said input signal with a storage node, said storage node holding a value of said input signal when said track and hold circuit is switched to a hold mode;
produce a copy of said stored signal value with a current mirror of said track and hold circuit; and
switch said copy of said stored signal to be added to said signal value applied to said first output when said track and hold circuit is in said hold mode.

19. The circuit of claim 18, in which said track and hold circuit is further configured to produce a number of additional copies of said stored signal value with additional current mirrors associated with said track and hold circuit.

20. The circuit of claim 18, in which said track and hold circuit is part of a stage of a pipelined Analog-to-Digital Converter (ADC).

* * * * *